(12) United States Patent
Wang

(10) Patent No.: US 11,551,610 B2
(45) Date of Patent: Jan. 10, 2023

(54) DISPLAY AND DRIVING METHOD

(71) Applicant: WUHAN CHINA STAR OPTOELECTRONICS SEMICONDUCTOR DISPLAY TECHNOLOGY CO., LTD., Hubei (CN)

(72) Inventor: Hai Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 90 days.

(21) Appl. No.: 17/055,357

(22) PCT Filed: Jun. 4, 2020

(86) PCT No.: PCT/CN2020/094265
§ 371 (c)(1),
(2) Date: Nov. 13, 2020

(87) PCT Pub. No.: WO2021/217780
PCT Pub. Date: Nov. 4, 2021

(65) Prior Publication Data
US 2022/0189395 A1 Jun. 16, 2022

(30) Foreign Application Priority Data

Apr. 30, 2020 (CN) .......................... 202010363183.9

(51) Int. Cl.
*G03B 17/48* (2021.01)
*H01L 27/32* (2006.01)
(Continued)

(52) U.S. Cl.
CPC .......... *G09G 3/3233* (2013.01); *G03B 17/48* (2013.01); *G09G 3/3283* (2013.01);
(Continued)

(58) Field of Classification Search
None
See application file for complete search history.

(56) References Cited

U.S. PATENT DOCUMENTS 3,575,610 A * 4/1971 Okubo ................. G11C 19/184
327/295
5,867,137 A * 2/1999 Sugiyama ............ G09G 3/2018
345/89

(Continued)

FOREIGN PATENT DOCUMENTS

CN 102479485 A 5/2012
CN 103943059 A 7/2014
(Continued)

*Primary Examiner* — Patrick N Edouard
*Assistant Examiner* — Peijie Shen
(74) *Attorney, Agent, or Firm* — PV IP PC; Wei Te Chung; Ude Lu

(57) ABSTRACT

A display includes a camera under panel, a display panel, a frame rate controller, and a switching circuit. The display panel includes an under-panel camera region corresponding to the camera under-panel. A first pixel set, positioned in the under-panel camera region, driven by a first scan line, a second scan line, a first data line, a second data line, a third data line, and a fourth data line. The first pixel set includes a first pixel electrically connected to the first scan line and the third data line, a second pixel electrically connected to the second scan line and the third data line, a third pixel electrically connected to the first scan line and the first data line, a fourth pixel electrically connected to the second scan line and the second data line, and a fifth pixel electrically connected to the second scan line and the fourth data line.

10 Claims, 4 Drawing Sheets

(51) Int. Cl.
*G09G 3/3233* (2016.01)
*G09G 3/3283* (2016.01)

(52) U.S. Cl.
CPC . *H01L 27/3234* (2013.01); *G09G 2300/0452* (2013.01); *G09G 2320/0209* (2013.01)

(56) References Cited

U.S. PATENT DOCUMENTS

| | | | | |
|---|---|---|---|---|
| 2005/0270258 | A1* | 12/2005 | Shin | G09G 3/3275 345/76 |
| 2006/0007195 | A1* | 1/2006 | Hu | G09G 3/3648 345/204 |
| 2006/0028415 | A1* | 2/2006 | Yang | G09G 3/3648 345/89 |
| 2006/0077197 | A1* | 4/2006 | Lin | G09G 3/3677 345/204 |
| 2007/0176663 | A1* | 8/2007 | Bisanti | H03L 7/10 327/295 |
| 2011/0260951 | A1 | 10/2011 | Hwang | |
| 2012/0133682 | A1 | 5/2012 | Kawano | |
| 2014/0146028 | A1* | 5/2014 | Choi | G09G 3/3225 345/212 |
| 2015/0002560 | A1* | 1/2015 | Kwon | G09G 3/3266 345/691 |
| 2015/0009194 | A1* | 1/2015 | Kim | G09G 3/3233 345/80 |
| 2015/0221260 | A1* | 8/2015 | Cho | G09G 3/2003 345/83 |
| 2015/0248855 | A1* | 9/2015 | Kim | G09G 3/3291 345/83 |
| 2015/0339972 | A1* | 11/2015 | Xu | G09G 3/3225 345/206 |
| 2016/0171941 | A1* | 6/2016 | Shiomi | G02F 1/136286 345/694 |
| 2016/0246091 | A1 | 8/2016 | Chang et al. | |
| 2017/0139294 | A1* | 5/2017 | Kim | G02F 1/136213 |
| 2019/0326366 | A1* | 10/2019 | Fan | H01L 27/3211 |
| 2020/0066809 | A1* | 2/2020 | Liu | H01L 27/3234 |
| 2020/0135148 | A1* | 4/2020 | Bai | G09G 3/20 |
| 2020/0286418 | A1* | 9/2020 | Lee | G09G 3/3677 |
| 2021/0041923 | A1* | 2/2021 | Bai | G06F 1/189 |
| 2021/0043166 | A1* | 2/2021 | Zhao | G09G 5/14 |
| 2021/0065625 | A1* | 3/2021 | Wang | G09G 3/2074 |
| 2021/0248945 | A1* | 8/2021 | Liu | H04N 5/2257 |
| 2021/0257419 | A1* | 8/2021 | Jang | H01L 27/326 |
| 2021/0327958 | A1* | 10/2021 | Li | H01L 27/156 |
| 2021/0327967 | A1* | 10/2021 | Zhang | G09G 3/20 |
| 2021/0335865 | A1* | 10/2021 | Wang | H01L 31/125 |
| 2021/0343247 | A1* | 11/2021 | Pyo | H01L 27/3227 |
| 2021/0408102 | A1* | 12/2021 | Chen | H01L 27/156 |
| 2021/0408439 | A1* | 12/2021 | Wang | H01L 27/3234 |
| 2022/0076623 | A1* | 3/2022 | Yang | G09G 3/20 |

FOREIGN PATENT DOCUMENTS

| | | |
|---|---|---|
| CN | 104166288 A | 11/2014 |
| CN | 206353536 U | 7/2017 |
| CN | 108364967 A | 8/2018 |
| CN | 108461521 A | 8/2018 |
| CN | 108769304 A | 11/2018 |
| CN | 109599053 A | 4/2019 |
| CN | 109671754 A | 4/2019 |
| CN | 110391267 A | 10/2019 |
| CN | 110444570 A | 11/2019 |
| CN | 110890412 A | 3/2020 |

\* cited by examiner

DISPLAY AND DRIVING METHOD

FIELD OF THE INVENTION

The present invention relates to a display technique, and more particularly, to a display and a driving method.

BACKGROUND

As the development trend of the full screen, the screen-to-body ratio of a cell phone becomes an important indicator. The camera under panel (CUP) is to put the camera under the panel. In this way, the panel region above the camera could still normally display and thus the full screen is accomplished. In order to raise the photographing effect of the camera, the pixel per inch (PPI) of the panel region above the camera is reduced to allow more light to pass through the panel to the sensor of the camera. However, this makes the luminance of this region lower than adjacent regions. In order to compensate the luminance, a lower data voltage is applied to the pixels in this region to get a higher driving voltage. But the high driving voltage will reduce the lifetime of the pixels in this region.

SUMMARY

One objective of an embodiment of the present invention is to provide a display. By simplifying the industrial design of the display, the difficulty for manufacturing the display having a camera under panel is reduced.

According to an embodiment of the present invention, a display is disclosed. The display comprises a camera under panel, configured to transform a received light into an electric signal; a display panel; a frame rate controller, configured to output a driving signal according to an add frame and an even frame of a picture; and a switching circuit, electrically connected to the frame rate controller, the first pixel and the second pixel, configured to control the third data line to transmit a data signal to the first pixel when the add frame is displayed, and to control third data line to transmit the data signal to the second pixel when the even frame is displayed. The display panel comprises an under-panel camera region, corresponding to the camera under-panel; a non-under-panel camera region, adjacent to the under-panel camera region; a first pixel set, positioned in the under-panel camera region, driven by a first scan line, a second scan line, a first data line, a second data line, a third data line, and a fourth data line; and a second pixel set, positioned in the non-under-panel camera region, comprising a plurality of pixels. The first pixel set comprises a first pixel, electrically connected to the first scan line and the third data line; a second pixel; electrically connected to the second scan line and the third data line, wherein lights generated from the first pixel and the second pixel have an identical color; a third pixel, electrically connected to the first scan line and the first data line; a fourth pixel, electrically connected to the second scan line and the second data line; and a fifth pixel, electrically connected to the second scan line and the fourth data line.

In some embodiments, the switching circuit comprises: an inverter, electrically connected to the frame rate controller, configured to output an inverted driving signal; and a switch, electrically connected to the inverter, the frame rate controller, the first pixel and the second pixel, configured to control the third data line to transmit the data signal to the first pixel according to the driving signal when the add frame is displayed and to control the third data line to transmit the data signal to the second pixel according to the inverted driving signal when the add frame is displayed.

In some embodiments, the switch comprises: a first thin film transistor (TFT), having a first control end, configured to receive the driving signal, a first input end electrically connected to the third data line, and a first output end electrically connected to the first pixel; and a second TFT, having a second control end, configured to receive the inversed driving signal, a second input end electrically connected to the third data line, and a second output end electrically connected to the second pixel.

In some embodiments, the first pixel and the second pixel generate blue lights, the fourth pixel and the fifth pixel generate green lights, and the third pixel generates red lights.

In some embodiments, the second pixel set is driven by a third scan line, a fourth scan line, a fifth data line, a sixth data line, a seventh data line, and an eighth data line, and the second pixel set comprises: a sixth pixel, electrically connected to the third scan line and the fifth data line; a seventh pixel, electrically connected to the fourth scan line and the sixth data line; an eighth pixel, electrically connected to the third scan line and the seventh data line; and a ninth pixel, electrically connected to the fourth scan line and the eighth data line.

In some embodiments, the sixth pixel generates red lights, the seventh pixel and the ninth pixels generate green lights, and the eighth pixel generates blue lights.

In some embodiments, the display further comprises a source driver. The fifth data line, the sixth data line, the seventh data line, and the eighth data line are electrically connected to the source driver.

In some embodiments, the display further comprises a source driver. The first data line, the second data line, the third data line, and the fourth data line are electrically connected to the source driver.

In some embodiments, the display further comprises a source driver. The frame rate controller is integrated in the source driver.

In some embodiments, each of a surface area of the first pixel and a surface area of the second pixel is larger than a surface area of a pixel in the second pixel set.

In contrast to the conventional art, a display according to an embodiment of the present invention increases the surface area of the pixel. Without increasing the complexity of the manufacturing process, the present invention could reduce the industrial design of the display and thus reduce the difficulty for manufacturing the display having a camera under panel. In addition, with the driving method of the display, the present invention could maintain the luminance of the display region above the camera under panel without raising the driving current. This could reduce the time for pixels to generate lights and increase the lifetime of the pixels.

Embodiments of the present application are illustrated in detail in the accompanying drawings, in which like or similar reference numerals refer to like or similar elements or elements having the same or similar functions throughout the specification. The embodiments described below with reference to the accompanying drawings are exemplary and are intended to be illustrative of the present application, and are not to be construed as limiting the scope of the present application.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

Figure 1A:
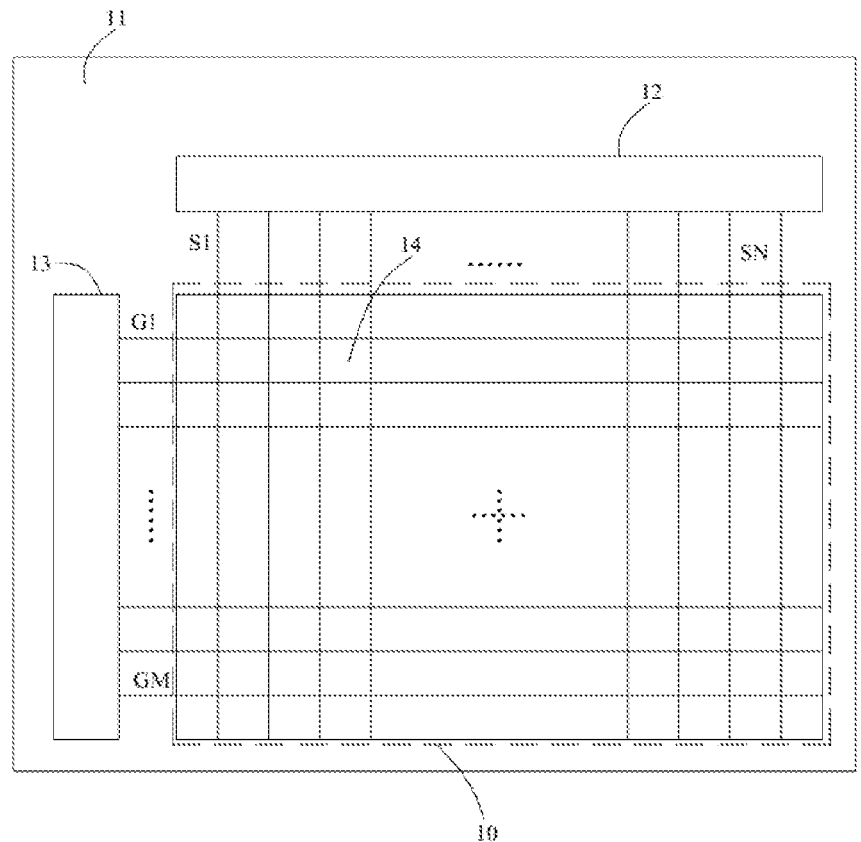
FIG. 1A is a diagram of a display according to an embodiment of the present invention.

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

Please refer to FIG. 1A. FIG. 1A is a diagram of a display according to an embodiment of the present invention. The display comprises a display panel. The display panel comprises a display region 10 and a non-display region 11. The display panel further comprises a plurality of data lines S1-SN, a plurality of scan lines G1-GM, at least one source driver 12, and at least one gate driver 13.

The data lines S1-SN and the scan lines G1-GM are positioned on the display region 10. Specifically, the data lines S1-SN are positioned on the display region 10 and extend to the source driver 12. The scan lines G1-GM are positioned on the display region 10 and extend to the gate driver 13. The data lines S1-SN are formed along the first direction and the scan lines G1-GM are formed along the second direction. The first direction is orthogonal to the second direction. The data lines S1-SN and the scan lines G1-GM define a plurality of pixels 14. The source driver 12 is positioned on the non-display region 20. The source driver 12 is electrically connected to the data lines S1-SN to provide the data signal. The data signal is used to write data into pixels 14. The gate driver 13 is positioned on the non-display region 20. The gate driver 13 is electrically connected to the gate lines G1-GM and provides the scan signal to the scan lines G1-GM.

Figure 1B:
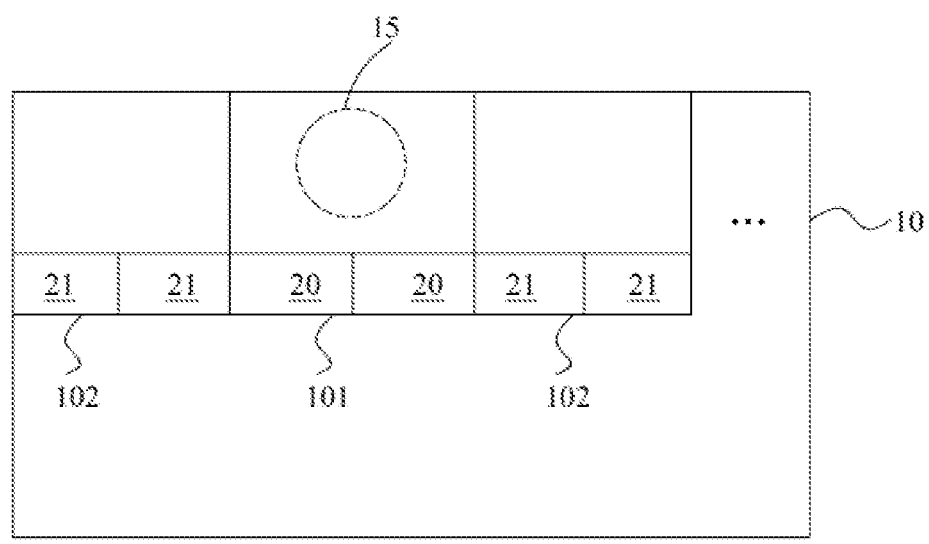
FIG. 1B is a diagram of a display region shown in FIG. 1A.

Please refer to FIG. 1A and FIG. 1B. FIG. 1B is a diagram of a display region shown in FIG. 1A. The display comprises a camera under panel 15. The camera under panel 15 is used to transform the received light into an electric signal. The display region 10 comprises an under-panel camera region 101 and a non-under-panel camera region 102. The non-under-panel camera region 102 is adjacent to the under-panel camera region 101. The under-panel camera region 101 is corresponding to the camera under-panel 15. The camera under-panel 15 is on the back of the under-panel camera region 101 to define the under-panel camera region 101. That is, the under-panel camera region 101 is on the front of the camera under-panel 15. To be clear, the camera under-panel 15 is on the back of the under-panel camera region 101 through the direction into the paper of FIG. 1B. This means that the projection of the under-panel camera region 101 covers the camera under panel 15 and the projection of the non-under panel camera region 102 does not cover the camera under panel 15. The back of the non-under panel camera region 102 does not have the camera under panel 15. The display panel further comprises a plurality of first pixel sets 20 and a plurality of second pixel sets 21. The first pixel sets 20 are positioned on the under-panel camera region 101 and the second pixels sets 21 are positioned on the non-under-panel camera region 102.

Figure 2A:
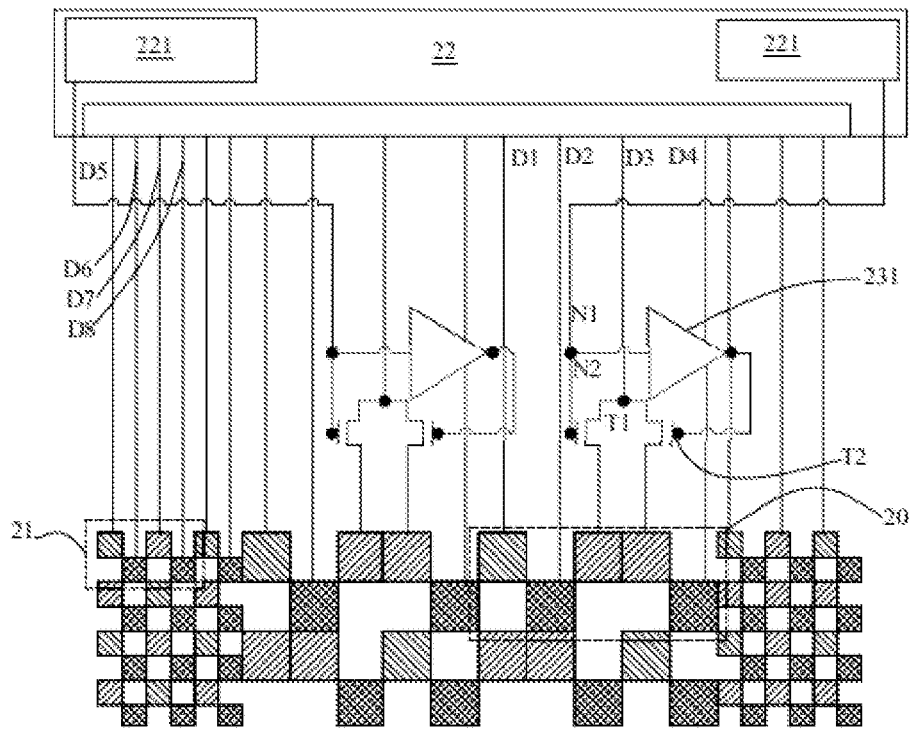
FIG. 2A is a diagram of a pixel driving circuit according to an embodiment of the present invention.
Figure 2B:
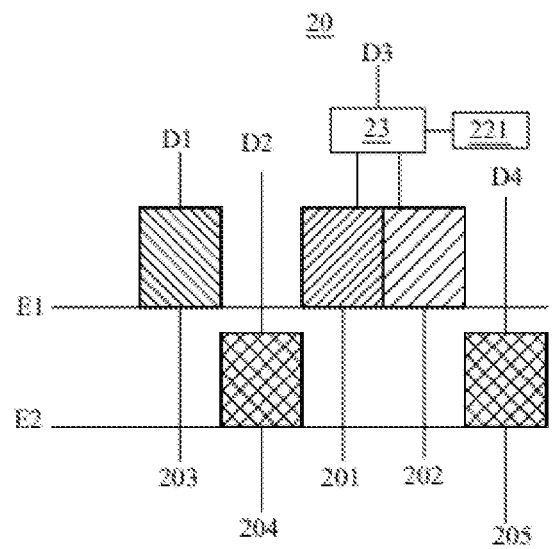
FIG. 2B is a diagram of a first pixel set shown in FIG. 2A.
Figure 2C:
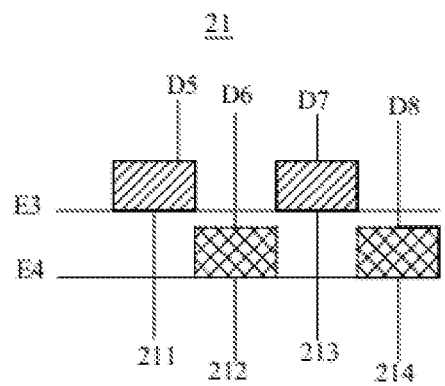
FIG. 2C is a diagram of a second pixel set shown in FIG. 2A.
Figure 2D:
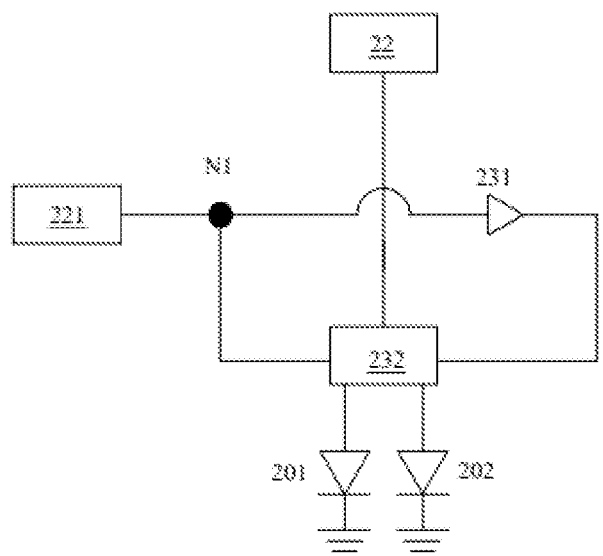
FIG. 2D is a diagram of a driving circuit of the first pixel and the second pixel shown in FIG. 2A.
Figure 2E:
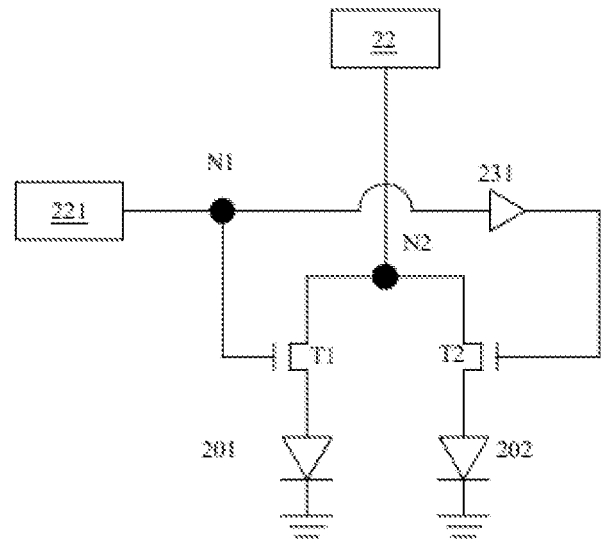
FIG. 2E is a diagram of a driving circuit shown in FIG. 2D.

Please refer to FIG. 2A, FIG. 2B, FIG. 2D and FIG. 2E. FIG. 2A is a diagram of a pixel driving circuit according to an embodiment of the present invention. FIG. 2B is a diagram of the first pixel set shown in FIG. 2A. FIG. 2D is a diagram of a driving circuit of the first pixel and the second pixel shown in FIG. 2A. FIG. 2E is a diagram of a driving circuit shown in FIG. 2D. The pixel driver comprises a source driver 22. The source driver 22 comprises a frame rate controller 221. The source driver 22 is used to output a data signal. The frame rate controller 221 is integrated in the source driver 22. The frame rate controller has a fourth output end and is configured to output a driving signal according to an add frame and an even frame of a picture. The driving signal could be a high voltage level signal or a low voltage level signal.

Please refer to FIG. 2B, FIG. 2D and FIG. 2E. The pixel driver further comprises a switching circuit 23. The switching circuit 23 is electrically connected to the frame rate controller 221. The switching circuit 23 comprises an inverter 231 and a switch 232. The switch 232 comprises a first thin film transistor (TFT) T1 and a second TFT T2. The first TFT T1 has a first control end, a first input end and a first output end. The second TFT T2 has a second control end, a second input end and a second output end. The inverter 231 has a third input end and a third output end. The inverter 231 is electrically connected to the frame rate controller 221 and is configured to receive the driving signal from the frame rate controller 221 and output an inverted driving signal. For example, the inverter 231 could receive a high voltage level signal and outputs a low voltage level signal and could receive a low voltage level signal and outputs a high voltage level signal. The fourth output end of the frame rate controller 221 is electrically connected to the first control end of the first TFT T1 and the third input end of the inverter 231. The third output end of the inverter 231 is electrically connected to the second control end of the second TFT T2. The pixel driver further comprises a first node N1 and a second node N2. The first node N1 is electrically connected to the third input end, the fourth output end and a first control end. The second node N2 is electrically connected to the source driver 22, the first input end and the second input end.

Please refer to FIG. 2B. FIG. 2B is a diagram of the first pixel set shown in FIG. 2A. The first pixel set 20 is driven by the first scan line E1, the second scan line E2, the first data line D1, the second data line D2, the third data line D3 and the fourth data line D4. The first data line D1, the second data line D2, the third data line D3 and the fourth data line D4 are formed along the first direction. The first scan line E1 and the second scan line E2 are formed along the second direction. The first direction is orthogonal to the second direction. The first data line D1, the second data line D2, the third data line D3 and the fourth data line D4 are electrically connected to the source driver 22. The first scan line E1 and the second scan line E2 are electrically connected to the gate driver 13. The first pixel set comprises a first pixel 201, a second pixel 202, a third pixel 203, a fourth pixel 204, and a fifth pixel 205. The first pixel 201 is electrically connected to the first scan line E1, the third data line D3, and the switching circuit 23. The second pixel 202 is electrically connected to the first scan line E1, the third data line D3 and the switching circuit 23. The third pixel 203 is electrically connected to the first scan line E1 and the first data line D1. The fourth pixel 204 is electrically connected to the second scan line E2 and the second data line D2. The fifth pixel is electrically connected to the second scan line E2 and the fourth data line D4. The first pixel 201, the third pixel 203, and the fourth pixel generate lights of different colors. The first pixel 201 and the second pixel generate lights of the same color. The second pixel 202 and the fifth pixel 205 generate lights of different colors. The light generated by the fifth pixel 205 could have the same color as the lights generated by the third pixel 203 and/or the fourth pixel 204. For example, the first pixel 201 and the second pixel 202 generate blue lights. The third pixel 203 generates a red light. The fourth pixel 204 generates a green light. The fifth pixel 205 generates a green light.

The switching circuit 23 is electrically connected to the frame rate controller 221, the first pixel 201 and the second pixel 202 and is configured to control the third data line D3 to transmit the data signal to the first pixel 201 when the add frame is displayed, and to control the third data line D3 to transmit the data signal to the second pixel D2 when the even frame is displayed. Please refer to FIG. 2D. The switch 232 is electrically connected to the inverter 231, the frame rate controller 221, the first pixel 201 and the second pixel 202. The switch is configured to control the third data line D3 to transmit the data signal to the first pixel 201 according to the driving signal when the add frame is displayed and to control the third data line D3 to transmit the data signal to the second pixel 202 according to the inverted driving signal when the add frame is displayed.

Please refer to FIG. 2A and FIG. 2E. The first TFT T1 is configured to drive the first pixel 201. The first output end is electrically connected to the first pixel 201. The first control end is configured to receive the driving signal. The first output end is electrically connected to the third data line D3. The second TFT T2 is configured to drive the second pixel 202. The second output end is electrically connected to the second pixel 202. The second control end is configured to receive the reversed driving signal. The second input end is electrically connected to the third data line D2. For example, in the odd frames, the frame rate controller 221 outputs the driving signal, such as a low voltage level. The first TFT T1 is turned on and the first pixel 201 generates lights. The inverter 231 receives the driving signal (the low voltage level) outputted from the frame rate controller 221 and outputs the reversed driving signal (the high voltage level). The second TFT T2 is turned off and thus the second pixel 202 does not generate lights. In the even frames, the frame rate controller 221 outputs the driving signal, such as a high voltage level signal such that the first TFT T1 is turned off and the first pixel 201 does not generate lights. The inverter 231 receives the driving signal (the high voltage level) outputted from the frame rate controller 221 and outputs the reversed driving signal (the low voltage level). The second TFT T2 is turned on and thus the second pixel 202 generates lights. The inverter 231 receives the high voltage level or low voltage level signals from the frame rate controller 221 and outputs the low voltage level or high voltage level signals accordingly to drive the first TFT T1 or the second TFT T2. In one frame, one of the first pixel 201 and the second pixel 202 is driven. That is, the first pixel 201 and the second pixel 202 do not generate lights in the same frame.

Please refer to FIG. 2C. FIG. 2C is a diagram of the second pixel set shown in FIG. 2A. The second pixel set 21 is used to generate lights and comprises a plurality of pixels. The second pixel set 21 comprises at least a sixth pixel 211, a seventh pixel 212, an eighth pixel 213, and a ninth pixel 214. The second pixel set 21 is driven by a third scan line E3, a fourth scan line E4, a fifth data line D5, a sixth data line D6, a seventh data line D7, and an eighth data line D8. The fifth data line D5, the sixth data line D6, the seventh data line D7, and the eighth data line D8 are formed along the first direction. The third scan line E3 and the fourth scan line E4 are formed along the second direction. The first direction is orthogonal to the second direction. The fifth data line D5, the sixth data line D6, the seventh data line D7, and the eighth data line D8 are electrically connected to the source driver 22. The third scan line E3 and the fourth scan line E4 are electrically connected to the gate driver 13. The sixth pixel 211 is electrically connected to the third scan line E3 and the fifth data line D5. The seventh pixel 212 is electrically connected to the fourth scan line E4 and the sixth data line D6. The eighth pixel 213 is electrically connected to the third scan line E3 and the seventh data line D7. The ninth pixel 214 is electrically connected to the fourth scan line D4 and the eighth data line D8. The sixth pixel 211, the seventh pixel 212, and the eighth pixel 213 generate lights of different colors. The eighth pixel 213 and the ninth pixel 214 generate lights of different colors. The light generated by the ninth pixel 214 could have the same color as the lights generated by the sixth pixel 211 and/or the seventh pixel 212. For example, the sixth pixel 211 generates a red light. The seventh pixel 212 generates a green light. The eighth pixel 213 generates a blue light. The ninth pixel 214 generates a green light. The first pixel set 20 comprises 5 pixels and the second pixel set 21 comprises 4 pixels. Therefore, the surface area of the first pixel set 20 is larger than the surface area of the second pixel set 21. In order to raise the photographing effect of the camera under panel 15 and allow more light to reach the camera under panel 15, the pixels per inch (PPI) of the under-panel camera region 101 is less than the PPI of the non-under-panel region 102. However, because the surface area of the first pixel set 20 is larger than the surface area of the second pixel set 21, the area of the first pixel set 20 for generating lights is increased. This could maintain the luminance of the under-panel camera region 101 above the camera under panel 15.

In some embodiments, the surface area of one pixel of the first pixel set 20 is larger than one pixel of the second pixel set 21. That is, the surface area of one of the first pixel 201, the second pixel 202, the third pixel 203, the fourth pixel 204 and the fifth pixel 205 is larger than the surface area of one of the sixth pixel 211, the seventh pixel 212, the eighth pixel 213 and the ninth pixel 214. For example, the surface area of the first pixel 201 is larger than the surface area of the sixth pixel 211. Or, the surface area of the second pixel 202 is larger than the surface area of the seventh pixel 212. In some embodiments, each of the pixels in the first pixel set 20 is larger than any one of the pixels in the second pixel set 21. For example, the surface area of the first pixel 201 is larger than the surface area of any one of the sixth pixel 211, the seventh pixel 212, the eighth pixel 213 and the ninth pixel 214. The PPI of the under-panel camera region 101 is less than the PPI of the non-under-pane camera region 102 but the surface area of the pixels in the first pixel set 20 is larger than the surface area of the pixels in the second pixel set 21. Thus, the area of the first pixel set 20 for generating lights is increased such that the luminance of the under-panel camera region 101 is maintained.

The above-mentioned pixels, as a light source, could be implemented with light emitting diodes (LEDs) or organic light emitting diodes (OLEDs). An OLED could comprise a substrate; a P-type common layer, a light emitting layer and an N-type common layer formed on the substrate; an anode formed between the substrate and the P-type common layer; a cathode formed on the N-type common layer. The P-type common layer is used for the electron holes to inject and transmit. The P-type common layer comprises a hole injection layer and a hole transmission layer. Thus, the P-type common layer could be called a hole transmission function layer. The N-type common layer is formed on the P-type common layer. The N-type common layer is for the electrons to inject and transmit. The N-type common layer comprises an electron injection layer and an electron transmission layer. Thus, the N-type common layer could be called an electron transmission function layer. The light emitting layer is formed between the P-type common layer and the N-type common layer. The light emitting layer is made of organic semiconductors, which has a specific energy band. The light emitting layer could receive electrons migrated from the cathode and generate photons having a specific wavelength after the electrons and holes recombine with each other.

In some embodiments, the OLED could be positioned on a flexible substrate. A flexible circuit board and a driver are positioned under the flexible substrate. The flexible circuit board and the driver are bound together to form a flexible light emitting equipment, which could be used as a bendable display screen.

The LED could comprise a substrate; a N-type semiconductor layer, a light emitting layer and a P-type semiconductor layer on the substrate; a cathode formed between the substrate and the N-type semiconductor layer or on the N-type semiconductor layer; and an anode formed on the P-type semiconductor layer. The P-type semiconductor layer is used for the electron holes to inject and transmit. The P-type semiconductor layer comprises a P-type bounding layer and a P-type contact layer. Therefore, the P-type semiconductor layer could be called a hole transmission function layer. The N-type semiconductor layer is used for the electrons to inject and transmit. The N-type semiconductor layer comprises an N-type bounding layer and a N-type contact layer. Therefore, the N-type semiconductor layer could be called an electron transmission function layer. The light emitting layer is made of non-organic semiconductors, which has a specific energy band. The light emitting layer could receive electrons migrated from the cathode and generate photons having a specific wavelength after the electrons and holes recombine with each other.

In some embodiments, in the first pixel set 20, the first pixel 201 and the second pixel 202 generate blue lights. The third pixel 203 generates a red light. The fourth pixel 204 generates a green light. The fifth pixel 205 generates a green light. In the second pixel set 21, the sixth pixel 211 generates a red light. The seventh pixel 212 generates a green light. The eighth pixel 213 generates a blue light. The ninth pixel 214 generates a green light. In the odd frames, the frame rate controller 221 outputs a low voltage level such that the first TFT T1 is turned on and the first pixel 201 generates lights.

The inverter 231 receives the low voltage level signal from the frame rate controller 221 and output a high voltage level signal such that the second TFT T2 is turned off and the second pixel 202 does not generate light. In the even frames, the frame rate controller 221 outputs a high voltage level such that the first TFT T1 is turned off and the first pixel 201 does not generate lights. The inverter 231 receives the high voltage level signal from the frame rate controller 221 and output a low voltage level signal such that the second TFT T2 is turned on and the second pixel 202 generates lights. However, both in the odd frames and even frames, the source driver 22 turns on the eighth pixel 213. By continuously turning on the eighth pixel 213 to generate lights, the first pixel 201 and the second pixel 202 could be turned on alternatively such that the lifetime of the first pixel 201 and the second pixel 202 could be increased.

Figure 3:
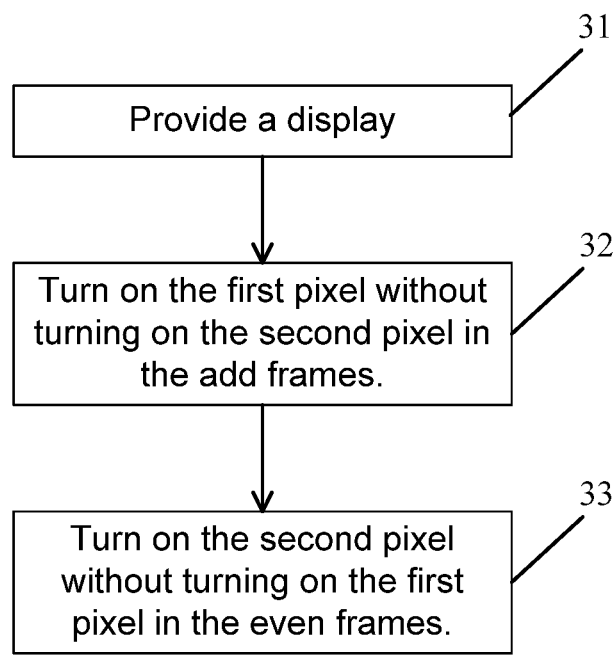
FIG. 3 is a flow chart of a driving method of a display according to an embodiment of the present invention.

Please refer to FIG. 3. FIG. 3 is a flow chart of a driving method of a display according to an embodiment of the present invention. A driving method for driving the display is disclosed. The driving method comprises:

Step 31: Provide a display. The display comprises the camera under panel, the under-panel camera region, the frame rate controller, the first pixel set, the inverter, the first TFT, the second TFT, the first node and the second node. The first TFT has the first control end, the first input end and the first output end. The second TFT has the second control end, the second input end and the second output end. The inverter has the third input end and the third output end. The source driver comprises the frame rate controller. The source driver is used to output the data signal. The frame rate controller is integrated in the source driver. The frame rate controller has the fourth output end and is configured to output the driving signal according to the add frames and even frames. The driving signal could be one of the high voltage level signal and the low voltage level signal. The inverter is electrically connected to the frame rate controller and is configured to receive the driving signal from the frame rate controller 221 and output the reversed driving signal. For example, the inverter receives the high voltage level signal and outputs the low voltage level signal or receives the low voltage level signal and outputs the high voltage level signal. The fourth output end of the frame rate controller is electrically connected to the first control end of the first TFT and the third input end of the inverter. The third output end of the inverter is electrically connected to the second control end of the second TFT. The first node is electrically connected to the third input end, the fourth output end and the first control end. The second node is electrically connected to the source driver, the first input end and the second input end. The camera under panel is positioned at the back of the under-panel camera region. The first pixel set is positioned on the under-panel camera region. The first pixel set comprises the first pixel and the second pixel. The second pixel is adjacent to the first pixel. The first pixel and the second pixel generate lights of the same color. The first output end of the first TFT is electrically connected to the first pixel. The second output end of the second TFT is electrically connected to the second pixel.

Step 32: Turn on the first pixel without turning on the second pixel in the add frames. Here, the frame rate controller outputs the driving signal, such as a low voltage level such that the first TFT is turned on and the first pixel generates lights. The inverter receives the driving signal from the frame rate controller and outputs the reversed driving signal. Here, the inverter receives the low voltage level signal and outputs the high voltage signal such that the second TFT is turned off and the second pixel does not generate lights.

Step 33: Turn on the second pixel without turning on the first pixel in the even frames. Here, the frame rate controller outputs the driving signal, such as a high voltage level such that the first TFT is turned off and the first pixel does not generate lights. The inverter receives the driving signal from the frame rate controller and outputs the reversed driving signal. Here, the inverter receives the high voltage level signal and outputs the low voltage signal such that the second TFT is turned on and the second pixel generates lights. In this way, the driving current is not increased but the luminance of the under-panel camera region could be maintained.

In contrast to the conventional display, which needs to keep turning on the pixels, in an embodiment, the first pixel and the second pixel are alternatively turned on such that the illuminating time for the first pixel and/or the second pixel is reduced and thus the life time of the first pixel and the second pixel is increased. Furthermore, in the add frames, the third pixel, the fourth pixel and the fifth pixel could be optionally turned on/off. In the even frames, the third pixel, the fourth pixel and the fifth pixel could be optionally turned on/off. For example, the first pixel and the second pixel are both blue pixels. The third pixel is a red pixel. The fourth pixel is a green pixel. The fifth pixel is a green pixel. Therefore, two blue pixels could be turned on in turns such that the illuminating time for each of the blue pixels is reduced. This increases the lifetime of the blue pixels and maintains the blue light luminance of the under-panel camera region.

The above embodiments could be used in various types of displays, such as LED displays or OLED displays. The OLED displays could be classified as two categories according to the driving methods—passive matrix OLED (PMOLED) and active matrix OLED (AMOLED), which corresponds to direct addressing and TFT matrix addressing. The AMOLED display has pixels arranged in a matrix and is an active display type. The AMOLED has a better light emitting performance and thus could be used in a large-size display device of a high resolution.

According to an embodiment of the present invention, a display is disclosed. The display increases the number of pixels and increases the surface areas of the pixels. Therefore, the display does not need to make the manufacturing process more complex and could actually simplify the industrial design to reduce the difficulty for manufacturing the display having the camera under panel. With the corresponding driving method of the display, the luminance of the under-panel camera region (which is above the camera under panel) could be maintained without increasing the driving current. Furthermore, this could also reduce the working time of the pixels and thus increase the lifetime of the pixels.

Above are embodiments of the present invention, which does not limit the scope of the present invention. Any modifications, equivalent replacements or improvements within the spirit and principles of the embodiment described above should be covered by the protected scope of the invention.

What is claimed is:
1. A display comprising:
a camera under panel, configured to transform a received light into an electric signal;

a display panel, comprising:
  an under-panel camera region, corresponding to the camera under-panel;
  a non-under-panel camera region, adjacent to the under-panel camera region;
  a first pixel set, positioned in the under-panel camera region, driven by a first scan line, a second scan line, a first data line, a second data line, a third data line, and a fourth data line, and the first pixel set comprising:
    a first pixel, electrically connected to the first scan line and the third data line;
    a second pixel; electrically connected to the first scan line and the third data line, wherein lights generated from the first pixel and the second pixel have an identical color;
    a third pixel, electrically connected to the first scan line and the first data line;
    a fourth pixel, electrically connected to the second scan line and the second data line; and
    a fifth pixel, electrically connected to the second scan line and the fourth data line; and
  a second pixel set, positioned in the non-under-panel camera region, comprising a plurality of pixels;
  a frame rate controller, configured to output a driving signal according to an odd frame and an even frame of a picture; and
  a switching circuit, electrically connected to the frame rate controller, the first pixel and the second pixel, configured to control the third data line to transmit a data signal to the first pixel only when the odd frame is displayed, and to control the third data line to transmit the data signal to the second pixel only when the even frame is displayed;
  wherein at least one pixel from the plurality of pixels of the second pixel set is configured to receive another data signal in both the odd frame and the even frame.

2. The display of claim 1, wherein the switching circuit comprises:
  an inverter, electrically connected to the frame rate controller, configured to output an inverted driving signal; and
  a switch, electrically connected to the inverter, the frame rate controller, the first pixel and the second pixel, configured to control the third data line to transmit the data signal to the first pixel according to the driving signal when the odd frame is displayed and to control the third data line to transmit the data signal to the second pixel according to the inverted driving signal when the odd frame is displayed.

3. The display of claim 2, wherein the switch comprises:
  a first thin film transistor (TFT), having a first control end, configured to receive the driving signal, a first input end electrically connected to the third data line, and a first output end electrically connected to the first pixel; and
  a second TFT, having a second control end, configured to receive the inversed driving signal, a second input end electrically connected to the third data line, and a second output end electrically connected to the second pixel.

4. The display of claim 1, wherein the first pixel and the second pixel generate blue lights, the fourth pixel and the fifth pixel generate green lights, and the third pixel generates red lights.

5. The display of claim 1, wherein the second pixel set is driven by a third scan line, a fourth scan line, a fifth data line, a sixth data line, a seventh data line, and an eighth data line, and the second pixel set comprises:
  a sixth pixel, electrically connected to the third scan line and the fifth data line;
  a seventh pixel, electrically connected to the fourth scan line and the sixth data line;
  an eighth pixel, electrically connected to the third scan line and the seventh data line; and
  a ninth pixel, electrically connected to the fourth scan line and the eighth data line.

6. The display of claim 5, wherein the sixth pixel generates red lights, the seventh pixel and the ninth pixels generate green lights, and the eighth pixel generates blue lights.

7. The display of claim 5, further comprising:
  a source driver;
  wherein the fifth data line, the sixth data line, the seventh data line, and the eighth data line are electrically connected to the source driver.

8. The display of claim 1, further comprising:
  a source driver;
  wherein the first data line, the second data line, the third data line, and the fourth data line are electrically connected to the source driver.

9. The display of claim 1, further comprising:
  a source driver, configured to output the data signal;
  wherein the frame rate controller is integrated in the source driver.

10. The display of claim 1, wherein each of a surface area of the first pixel and a surface area of the second pixel is larger than a surface area of a pixel in the second pixel set.

* * * * *